US012796038B2

(12) United States Patent
Kim et al.

(10) Patent No.: US 12,796,038 B2
(45) Date of Patent: Nov. 10, 2026

(54) P-N HETEROJUNCTION SEMICONDUCTOR DEVICE HAVING SPECIFIED MATERIALS FOR N- AND P-TYPE LAYERS

(71) Applicants: Hyundai Motor Company, Seoul (KR); Kia Corporation, Seoul (KR); Industry Academy Cooperation Foundation of Sejong University, Seoul (KR)

(72) Inventors: Taehyun Kim, Suwon-si (KR); Youngkyun Jung, Seoul (KR); You Seung Rim, Seoul (KR); Ji Young Min, Seoul (KR)

(73) Assignees: Hyundai Motor Company, Seoul (KR); Kia Corporation, Seoul (KR); Industry Academy Cooperation Foundation of Sejong University, Seoul (KR)

( * ) Notice: Subject to any disclaimer, the term of this patent is extended or adjusted under 35 U.S.C. 154(b) by 371 days.

(21) Appl. No.: 18/524,319

(22) Filed: Nov. 30, 2023

(65) Prior Publication Data

US 2025/0048662 A1 Feb. 6, 2025

(30) Foreign Application Priority Data

Aug. 2, 2023 (KR) ........................ 10-2023-0101226

(51) Int. Cl.

| | |
|---|---|
| ***H10D 62/82*** | (2025.01) |
| ***H10D 8/60*** | (2025.01) |
| ***H10D 62/60*** | (2025.01) |
| ***H10D 62/862*** | (2025.01) |
| *H10D 8/01* | (2025.01) |
| *H10P 14/20* | (2026.01) |
| *H10P 14/22* | (2026.01) |

(52) U.S. Cl.

CPC ......... *H10D 62/8271* (2025.01); *H10D 62/60* (2025.01); *H10D 62/862* (2025.01); *H10D 8/045* (2025.01); *H10D 8/051* (2025.01); *H10D 8/053* (2025.01); *H10D 8/60* (2025.01); *H10P 14/22* (2026.01); *H10P 14/3434* (2026.01)

(58) Field of Classification Search

CPC .. H10D 62/60; H10D 62/862; H10D 62/8271; H10P 14/3434

See application file for complete search history.

(56) References Cited

U.S. PATENT DOCUMENTS

| | | | | |
|---|---|---|---|---|
| 2014/0217405 A1* | 8/2014 | Sasaki | H10D 30/66 257/43 |
| 2018/0315820 A1* | 11/2018 | Kub | H10D 62/82 |
| 2024/0425656 A1* | 12/2024 | Yoshikawa | B82Y 20/00 |
| 2025/0287605 A1* | 9/2025 | Huang | H10D 30/6757 |

* cited by examiner

*Primary Examiner* — Yara B Green
*Assistant Examiner* — Christopher M Roland
(74) *Attorney, Agent, or Firm* — Slater Matsil, LLP

(57) ABSTRACT

An embodiment semiconductor device includes an n type layer disposed on a first surface of a substrate, the n type layer including beta-gallium oxide ($\beta$-$Ga_2O_3$), a p type layer disposed on the n type layer and including nickel oxide represented by a formula $M_yNi_{1-y}O_x$, wherein M is a doping element, x is $0.8 \leq x \leq 1.0$, and y is $0 \leq y < 1$, a first electrode disposed on the p type layer, and a second electrode disposed on a second surface of the substrate opposite the first surface.

20 Claims, 25 Drawing Sheets

10

P-N HETEROJUNCTION SEMICONDUCTOR DEVICE HAVING SPECIFIED MATERIALS FOR N- AND P-TYPE LAYERS

CROSS-REFERENCE TO RELATED APPLICATIONS

This application claims the benefit of Korean Patent Application No. 10-2023-0101226, filed on Aug. 2, 2023, which application is hereby incorporated herein by reference.

TECHNICAL FIELD

A semiconductor device and a method of manufacturing the same are disclosed.

BACKGROUND

Power conversion devices such as inverters, converters, and OBCs (on board chargers) play the role of converting electrical energy into a form suitable for electrical components, and power semiconductors perform switching and rectification operations in the components responsible for power conversion.

Existing power semiconductors mainly use silicon (Si) materials, but recently, gallium nitride (GaN) and silicon carbide (SiC) power semiconductors with improved performance have begun to be mass-produced and installed in vehicles. Recently, demands for ultra-high voltage and power ICs and interest in low-cost materials are increasing, and beta-gallium oxide ($\beta$-$Ga_2O_3$) (4.8 eV), which has a wider bandgap than 4H-SiC (3.2 eV), has recently received attention.

Meanwhile, the use of p type materials is necessary for further improvements in power semiconductor diodes and other devices that require lower resistivity ($R_{on}$) and higher breakdown voltage. Currently, the development of p-type $\beta$-$Ga_2O_3$ is not easy to implement and is not stable for commercialization.

SUMMARY

An embodiment provides a semiconductor device having a high breakdown voltage and low leakage current.

Another embodiment provides a method of manufacturing the semiconductor device.

According to an embodiment, a semiconductor device includes an n type layer disposed on a first surface of a substrate and including beta-gallium oxide ($\beta$-$Ga_2O_3$), a p type layer disposed on the n type layer and including nickel oxide represented by $M_yNi_{1-y}O_x$ (Chemical Formula 1), a first electrode disposed on the p type layer, and a second electrode disposed on a second surface of the substrate.

In Chemical Formula 1, M is a doping element, x is $0.8 \leq x \leq 1.0$, and y is $0 \leq y < 1$.

A P-N heterojunction may be formed at the contact surface of the n type layer and the p type layer.

The substrate may include n type gallium oxide ($Ga_2O_3$), and the n type gallium oxide may include n type gallium oxide doped with Si or Sn.

The substrate may have a doping concentration of about $1\times10^{16}$ $cm^{-3}$ to about $1\times10^{20}$ $cm^{-3}$.

A thickness of the substrate may be about 100 μm to about 700 μm.

The beta-gallium oxide may include beta-gallium oxide doped with Si or Sn.

The n type layer may have a doping concentration of about $1\times10^{15}$ $cm^{-3}$ to about $1\times10^{17}$ $cm^{-3}$.

A thickness of the n type layer may be about 1 μm to about 10 μm.

In Chemical Formula 1, y may be $0<y<1$, and in Chemical Formula 1, y may be $0.06 \leq y \leq 0.1$.

The doping element may include a monovalent element, a divalent element, or a combination thereof, and the monovalent element may include Li, K, Cu, Ag, Cs, or a combination thereof, and the divalent element may include Mg, Ca, Sr, Ba, or a combination thereof.

A thickness of the p type layer may be about 10 nm to about 300 nm.

The first electrode may be an anode, and the second electrode may be a cathode.

According to another embodiment, a method of manufacturing a semiconductor device includes forming an n type layer including beta-gallium oxide ($\beta$-$Ga_2O_3$) on a first surface of a substrate, forming a p type layer including the nickel oxide represented by Chemical Formula 1 on the n type layer, forming a first electrode on the p type layer, and forming a second electrode on a second surface of the substrate.

The p type layer may be formed by a radio frequency (RF) sputtering process, and the partial pressure of oxygen injected during the RF sputtering process may be about 5% to about 30%.

A semiconductor device according to an embodiment can have a high breakdown voltage while suppressing leakage current, and accordingly, high performance can be achieved with a simple process in a beta-gallium oxide ($\beta$-$Ga_2O_3$)-based device. This is a $\beta$-$Ga_2O_3$-based device and can contribute to the development of various device structures, including Schottky and MOS types as well as junction FETs.

DETAILED DESCRIPTION OF ILLUSTRATIVE EMBODIMENTS

Figure 1:
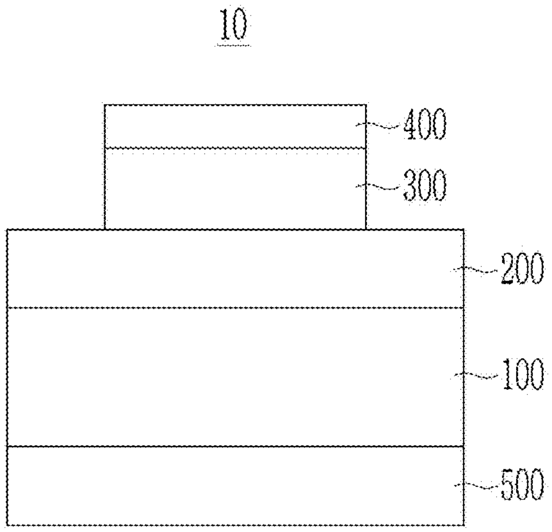
FIG. 1 is a cross-sectional view briefly illustrating the structure of a semiconductor device according to an embodiment.

The advantages, features, and aspects to be described hereinafter will become apparent from the following description of the embodiments with reference to the accompanying drawings, which is set forth hereinafter. However, the embodiments should not be construed as being limited to the embodiments set forth herein. Although not specifically defined, all of the terms including the technical and scientific terms used herein have meanings understood by ordinary persons skilled in the art. The terms defined in a generally used dictionary may not be interpreted ideally or exaggeratedly unless clearly defined. In addition, unless explicitly described to the contrary, the word "comprise", and variations such as "comprises" or "comprising", will be understood to imply the inclusion of stated elements but not the exclusion of any other elements.

Further, the singular includes the plural unless mentioned otherwise.

In the drawings, the thickness of layers, films, panels, regions, etc. are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

The semiconductor device according to an embodiment is a device based on beta-gallium oxide ($\beta$-$Ga_2O_3$), an ultra-wide band gap (UWBG) material, and may have a diode structure, but it is not limited to this structure, and it may achieve high breakdown voltage and low leakage current characteristics through P-N heterojunction.

FIG. 1 is a cross-sectional view briefly illustrating the structure of a semiconductor device according to an embodiment.

Referring to FIG. 1, a semiconductor device 10 according to an embodiment includes a substrate 100, an n type layer 200, a p type layer 300, a first electrode 400, and a second electrode 500.

The substrate 100 may include n type gallium oxide ($Ga_2O_3$). The n type gallium oxide may be beta-phase of beta-gallium oxide ($\beta$-$Ga_2O_3$). The n type gallium oxide may include undoped n type gallium oxide, n type gallium oxide doped with Si or Sn, or a combination thereof, for example, n type gallium oxide doped with Si or Sn may be used.

The substrate 100 may have a doping concentration of about $1\times10^{16}$ $cm^{-3}$ to about $1\times10^{20}$ $cm^{-3}$, for example, about $1\times10^{17}$ $cm^{-3}$ to about $1\times10^{19}$ $cm^{-3}$. When the substrate has a doping concentration within the ranges, appropriate values for on-resistance and breakdown voltage characteristics in a trade-off relationship may be secured.

The substrate 100 may have a thickness of about 100 μm to about 700 μm, for example, about 200 μm to about 700 μm.

The n type layer 200 is disposed as an epitaxial layer on the first surface of the substrate 100.

The n type layer 200 includes beta-gallium oxide ($\beta$-$Ga_2O_3$) as an n type semiconductor material. The beta-gallium oxide may include an undoped beta-gallium oxide, an Si- or Sn-doped beta-gallium oxide, or a combination thereof, for example, the Si- or Sn-doped beta-gallium oxide.

The n type layer 200 may have a doping concentration of about $1\times10^{15}$ cm 3 to about $1\times10^{17}$ $cm^{-3}$, for example, about $1\times10^{16}$ $cm^{-3}$ to about $1\times10^{17}$ $cm^{-3}$. When the n type layer has a doping concentration within the ranges, appropriate values for on-resistance and breakdown voltage characteristics in a trade-off relationship may be secured.

The n type layer 200 may have a thickness of about 1 μm to about 10 μm, for example, about 2 μm to about 10 μm.

The p type layer 300 is disposed on the n type layer 200 and includes nickel oxide as a p type semiconductor material. The p type layer 300 is disposed between the n type layer 200 and the first electrode 400 to form an interlayer.

According to an embodiment, as the p type layer 300 of a p type nickel oxide material is formed to be inserted between the n type layer 200 of an n type beta-gallium oxide material and the first electrode 400 of a metal material, P-N heterojunctions (hetero junctions) are formed on the contacting surface of the n type layer 200 and the p type layer 300, thereby obtaining a semiconductor device having high breakdown voltage and low leakage current characteristics.

The nickel oxide may be specifically represented by Chemical Formula 1.

$$M_yNi_{1-y}O_x \qquad \text{Chemical Formula 1:}$$

In Chemical Formula 1, M is a doping element, x is $0.8\leq x\leq1.0$, and y is $0\leq y<1$.

The nickel oxide, as shown in Chemical Formula 1, may be undoped $NiO_x$ or $NiO_x$ doped with a doping element.

Since conductivity of the nickel oxide is caused by a hole state induced by Ni vacancies, in oxygen-rich conditions, energy formation for the Ni vacancies is low, while energy formation for oxygen (O) vacancies is high. Accordingly, the Ni vacancies may be increased by adding impurities such as Li, wherein one hole goes to a balance band, keeping the charge neutral. Accordingly, when the nickel oxide is used to form the p type layer, a carrier concentration may be controlled by adjusting an oxygen content or doping.

In other words, when $NiO_x$ doped with a doping element is used to form the p type layer 300, the Ni vacancies may be increased to increase the conductivity of the nickel oxide, and the carrier concentration may be controlled, exhibiting more excellent high breakdown voltage and low leakage current characteristics.

The doping element may include a monovalent element, a divalent element, or a combination thereof. The monovalent element may include Li, K, Cu, Ag, Cs, or a combination thereof, for example, Li may be used. The divalent element may include Mg, Ca, Sr, Ba, or a combination thereof.

The doping element may have a content indicated by y, which is about $0\leq y<1$, for example, about $0<y<1$, or for example about $0.06\leq y\leq0.1$. When a nickel oxide doped with the content ranges is used to form a p type layer, conductivity and a carrier concentration may be increased, securing more excellent high breakdown voltage and low leakage current characteristics.

A thickness of the p type layer 300 may be about 10 nm to about 300 nm, for example, about 50 nm to about 300 nm.

The first electrode 400 is disposed on the p type layer 300 in the top of the substrate 100 and may be an anode.

The first electrode 400 may include a metal of Ni, Au, Ag, or a combination thereof, and for example, Ni metal may be used.

The first electrode 400 may have a single-layer or a multi-layer structure.

The second electrode 500 may be disposed at the bottom of the substrate 100, that is, on the second surface of the substrate 100, and may be a cathode.

The second electrode 500 may include metals such as Ti, Au, Al, Mo, or a combination thereof, and for example, metals such as Ti and Au may be used.

The second electrode 500 may have a single-layer or a multi-layer structure, and as for the multi-layer structure, a second electrode may include, for example, a Ti metal layer and an Au metal layer.

The above semiconductor device may exhibit high breakdown voltage and low leakage current characteristics by inserting the p type layer of a nickel oxide material between the n type layer of a $\beta$-$Ga_2O_3$ material and the first electrode of a Ni metal to form P-N heterojunctions on the interface thereof. Accordingly, the beta-gallium oxide ($\beta$-$Ga_2O_3$)-based device may realize high performance in a simple process, which may lead to developing a beta-gallium oxide ($\beta$-$Ga_2O_3$)-based device with various device structures including a junction FET (field effect transistor) as well as Schottky types and MOS (metal oxide semiconductor) types.

The semiconductor device can be manufactured in the following manner.

A substrate 100 is prepared, an n type layer 200, a p type layer 300, and a first electrode 400 are sequentially formed on the first surface of the substrate 100, and the second electrode 500 is formed on the second surface of the substrate 100.

For example, the second electrode 500, the substrate 100, the n type layer 200, the p type layer 300, and the first electrode 400 are sequentially deposited to form a desired structure through a lift-off process or an etching process.

The p type layer 300 may be formed by a radio frequency (RF) sputtering process.

In the RF sputtering process, an injected oxygen partial pressure may be about 5% to about 30% or, for example, about 10% to about 30%. When oxygen is injected within the ranges, the conductivity and carrier concentration of the nickel oxide may be controlled to exhibit more excellent high breakdown voltage and low leakage current characteristics.

According to the aforementioned method of manufacturing a semiconductor device, a semiconductor device having high performance such as low leakage current and high breakdown voltage characteristics in a simple process may be manufactured.

Hereinafter, the embodiments are illustrated in more detail with reference to examples. However, these examples are exemplary, and the scope of the claims is not limited thereto.

Example 1

With the same structure as in FIG. 1, a semiconductor device was manufactured by sequentially forming an n type layer 200, a p type layer 300, and a first electrode 400 on the first surface of a substrate 100, while forming a second electrode 500 on the second surface of the substrate 100.

Herein, the substrate 100 was prepared by using Sn-doped n type $Ga_2O_3$ to have a doping concentration of $4.3\times10^{18}$ $cm^{-3}$ and a thickness of 642 μm. The n type layer 200 was prepared by using Si-doped n type $\beta$-$Ga_2O_3$ to have a doping concentration of $3.5\times10^{16}$ $cm^{-3}$ and a thickness of 10 μm. The p type layer 300 was prepared by using undoped $NiO_x$ to have a thickness of 300 nm. The first electrode 400 was an anode prepared by using a Ni metal to have a thickness of 100 nm. The second electrode 500 was a cathode prepared by forming a 160 nm-thick Au metal layer and a 20 nm-thick Ti metal layer on the Au metal layer to have a multi-layer structure.

The p type layer was formed through a RF sputtering process and specifically through deposition by injecting 20% of an oxygen partial pressure into a NiO (Ni:O=1:1) target. As a result of X-ray photoelectron spectroscopy (XPS) analysis, the formed NiO thin film had 49.59 atom % of nickel (Ni) and 50.41 atom % of oxygen (O), which had an atomic ratio of about 1:1 and thus confirmed that the NiO thin film was stable.

Example 2

A semiconductor device was manufactured in the same manner as in Example 1 except that the p type layer 300 was prepared by using Li-doped $NiO_x$.

Comparative Example 1

A semiconductor device was manufactured in the same manner as in Example 1 except that the p type layer 300 was not formed.

Evaluation 1: Electrical Characteristics of Nickel Oxide Thin Films (1) In order to evaluate electrical characteristics of an undoped $NiO_x$ thin film used for forming a p type layer in Example 1, an undoped $NiO_x$ thin film was deposited on a slide glass through a RF sputtering process, while increasing the oxygen content, and then measured with respect to electrical characteristics, and the results are shown in FIGS. 2A to 2C.

Figure 2A:
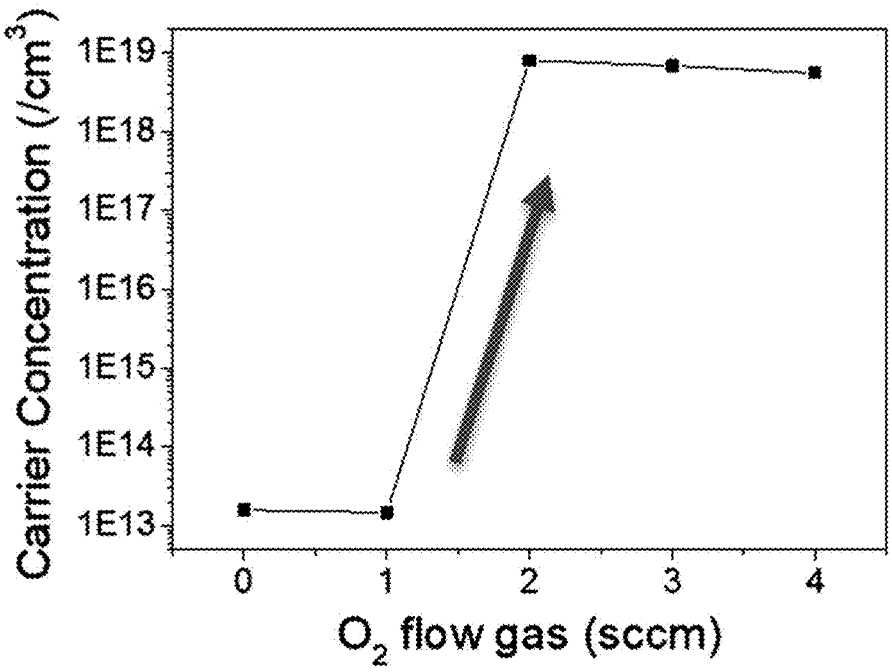
FIG. 2A is a graph showing the carrier concentration for an undoped $NiO_x$ thin film according to an embodiment.
Figure 2B:
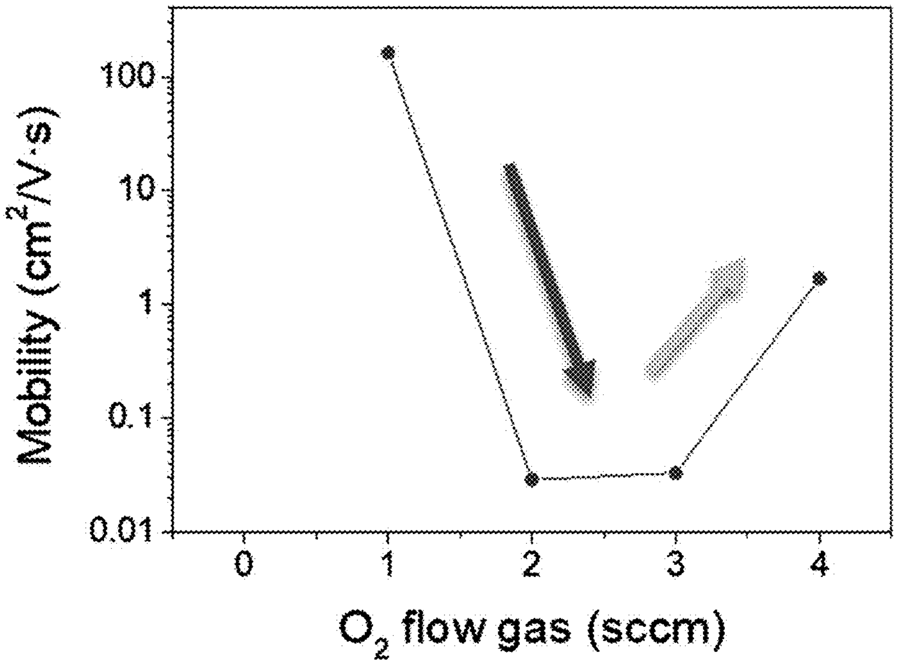
FIG. 2B is a graph showing the mobility for an undoped $NiO_x$ thin film according to an embodiment.
Figure 2C:
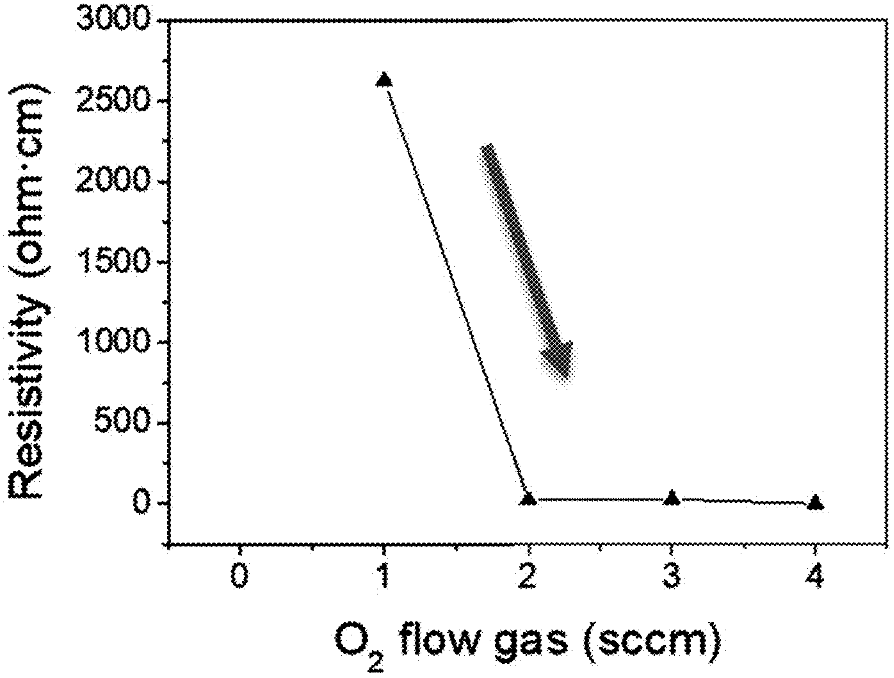
FIG. 2C is a graph showing the resistivity of an undoped $NiO_x$ thin film according to an embodiment.

FIG. 2A is a graph showing a carrier concentration for the undoped $NiO_x$ thin film according to an embodiment, FIG. 2B is a graph showing mobility for the undoped $NiO_x$ thin film according to an embodiment, and FIG. 2C is a graph showing resistivity of the undoped $NiO_x$ thin film according to an embodiment.

Referring to FIG. 2A, as the oxygen content was increased, the undoped $NiO_x$ thin film showed a tendency that the carrier concentration was increasing but then, converging. Referring to FIG. 2B, mobility of the undoped $NiO_x$ thin film significantly decreased from an oxygen content of 1 sccm to 2 sccm but increased again from 3 sccm. Referring to FIG. 2C, resistivity of the undoped $NiO_x$ thin film significantly decreased beyond an oxygen content of 1 sccm but from 2 sccm decreased to less than 1 Ωcm.

Figure 3A:
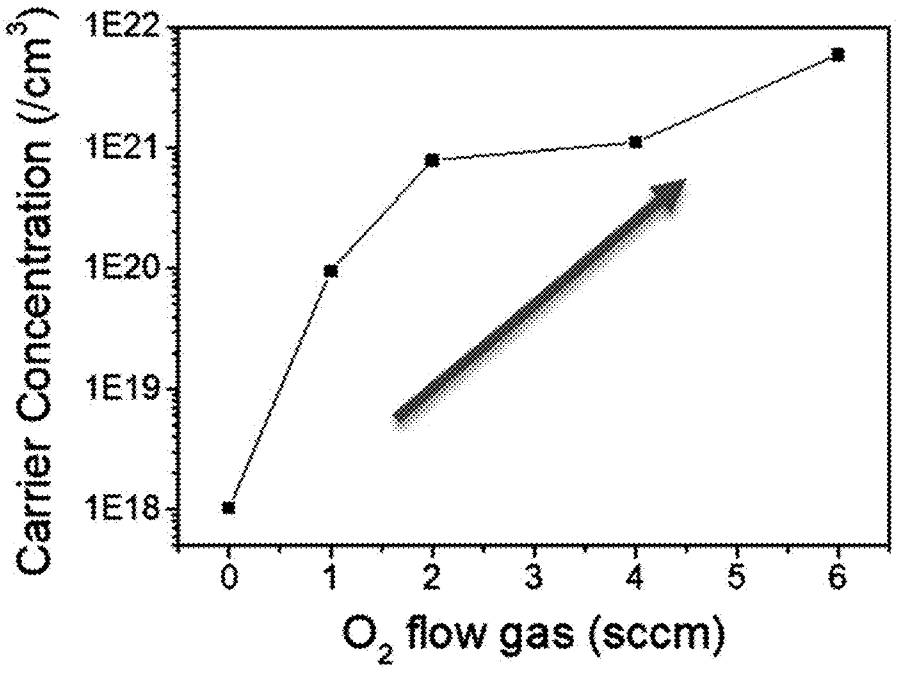
FIG. 3A is a graph showing the carrier concentration for a Li-doped $NiO_x$ thin film according to an embodiment.
Figure 3B:
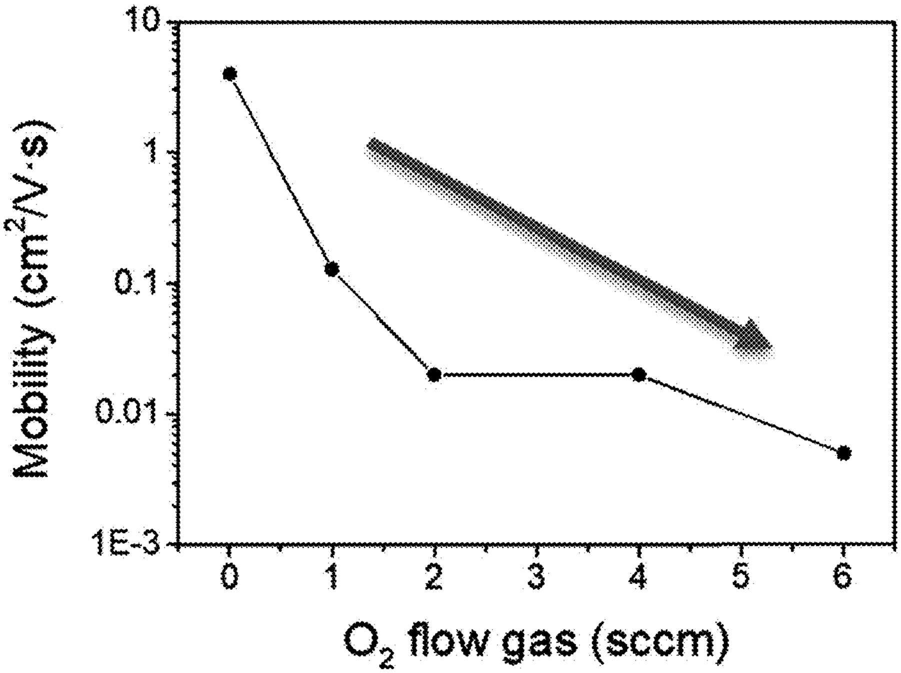
FIG. 3B is a graph showing the mobility for a Li-doped $NiO_x$ thin film according to an embodiment.
Figure 3C:
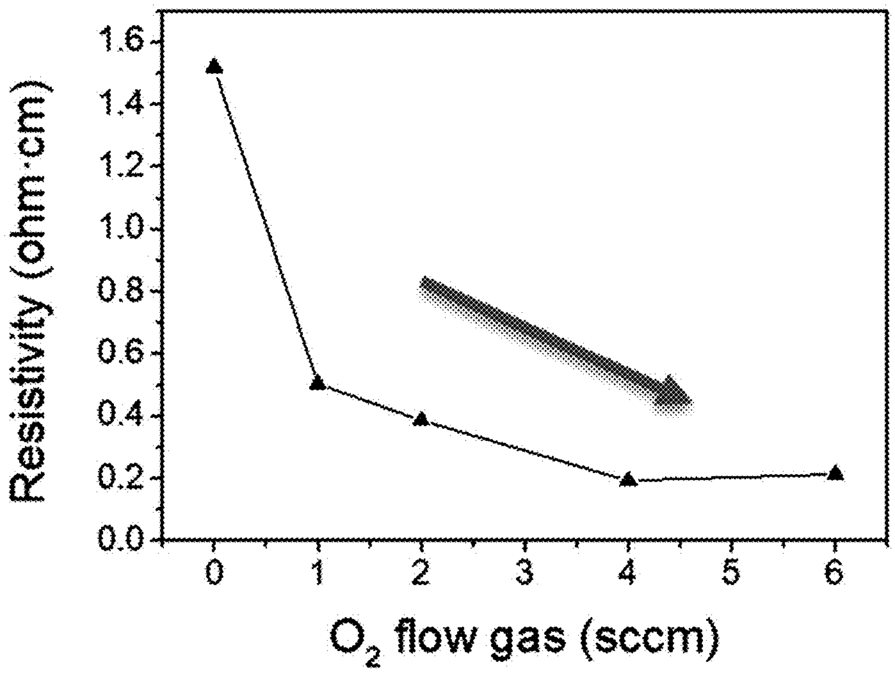
FIG. 3C is a graph showing the resistivity of a Li-doped $NiO_x$ thin film according to an embodiment.
Figure 4A:
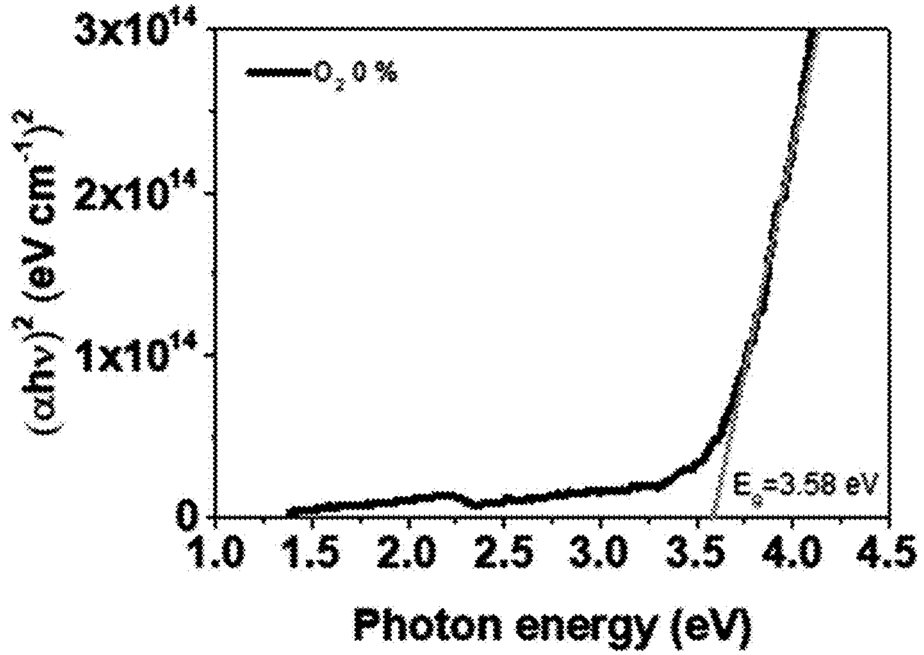
FIGS. 4A to 4E are graphs showing the bandgap according to oxygen partial pressure for an undoped $NiO_x$ thin film of Example 1, respectively.
Figure 4B:
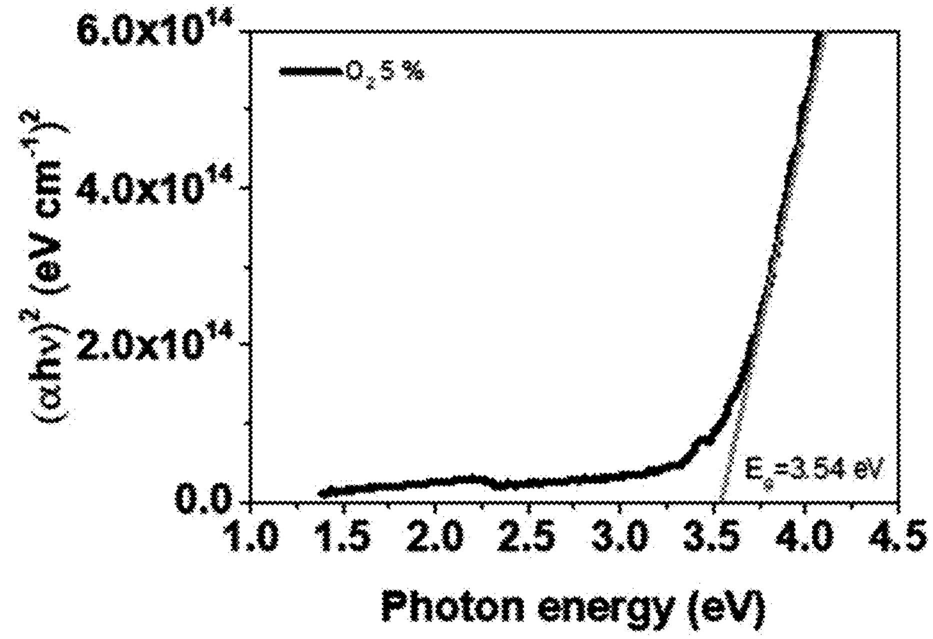
Figure 4C:
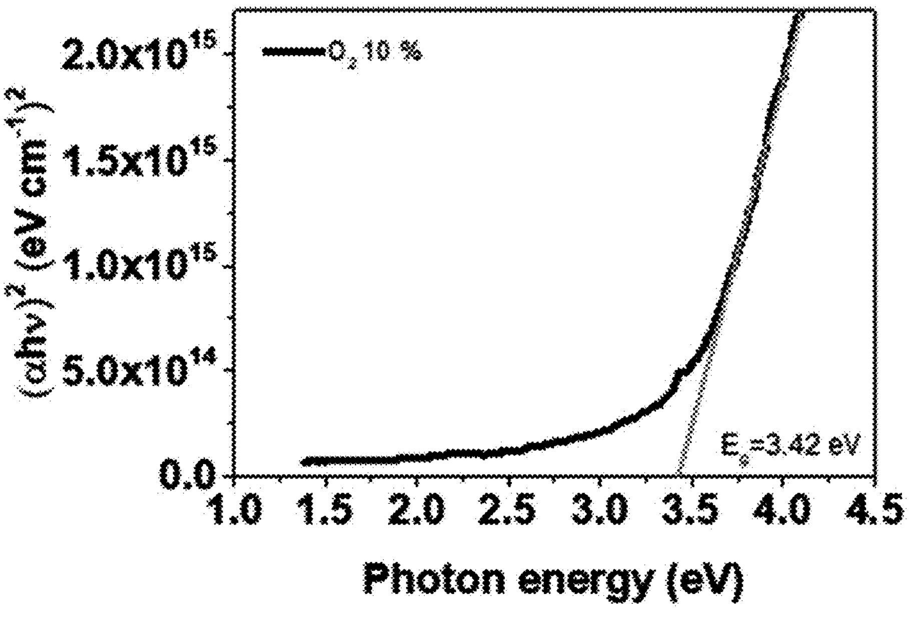
Figure 4D:
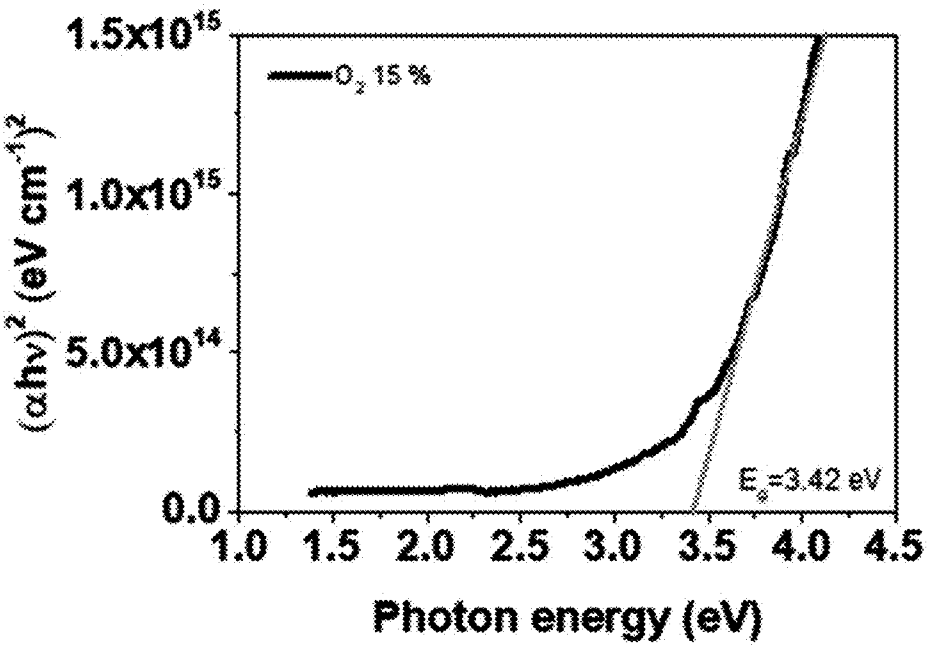
Figure 4E:
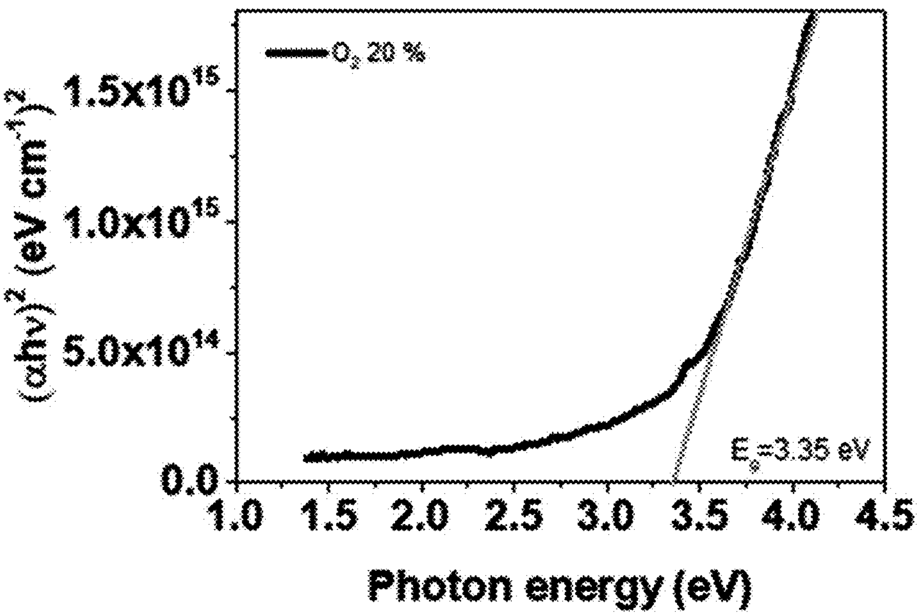
Figure 5A:
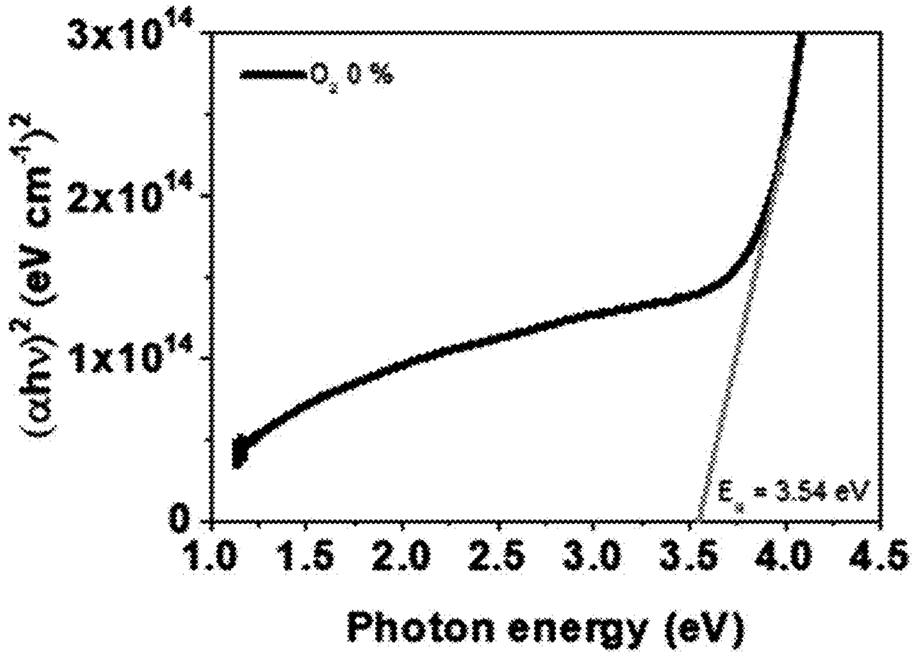
FIGS. 5A to 5E are graphs showing the bandgap according to oxygen partial pressure for a Li-doped $NiO_x$ thin film of Example 2, respectively.
Figure 5B:
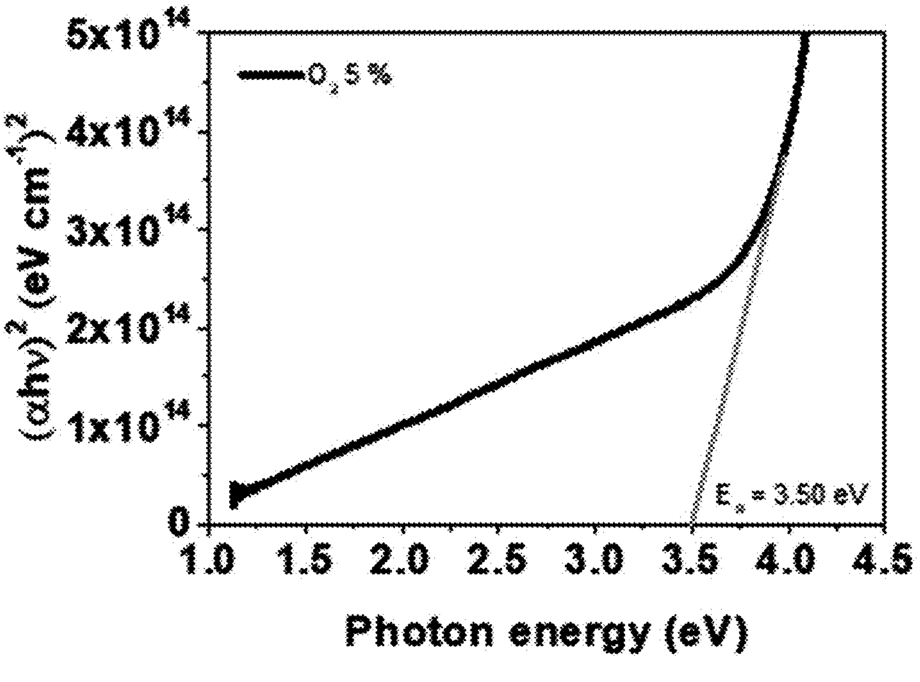
Figure 5C:
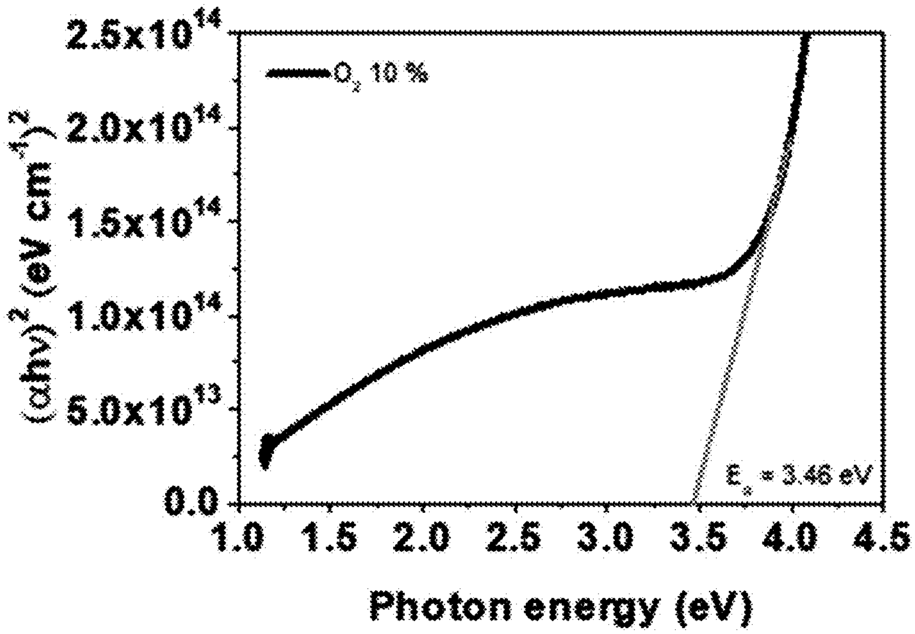
Figure 5D:
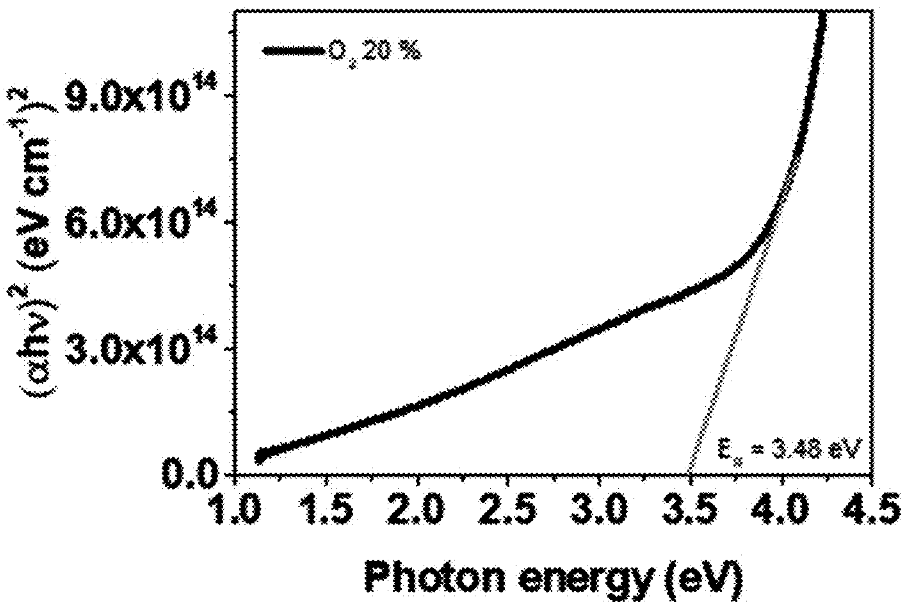
Figure 5E:
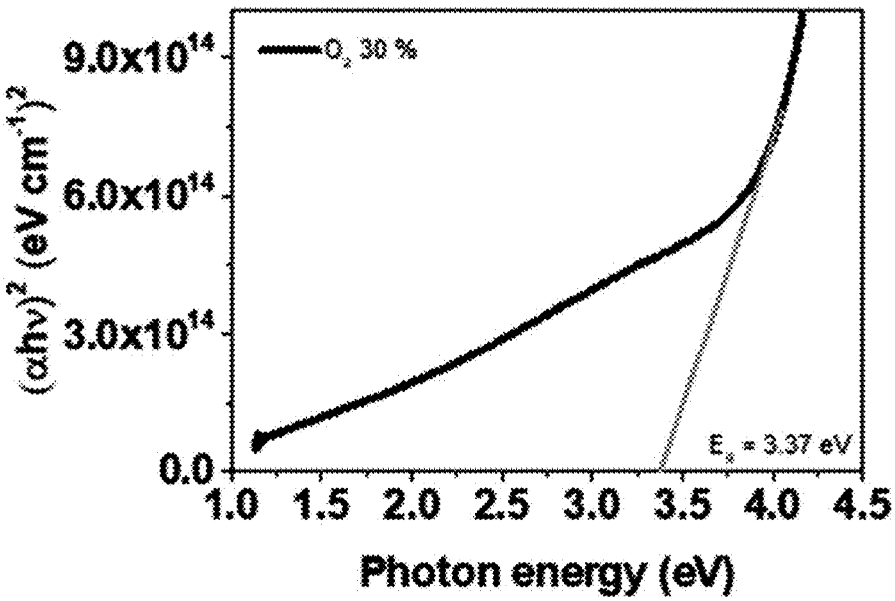

(2) In order to evaluate electrical characteristics of the Li-doped $NiO_x$ thin film used for forming a p type layer in Example 2, a Li-doped $NiO_x$ thin film was deposited on a slide glass through a RF sputtering process, while increasing an oxygen content, and then evaluated with respect to electrical characteristics through a hall effect measurement method, and the results are shown in FIGS. 3A to 3C.

FIG. 3A is a graph showing a carrier concentration for the Li-doped $NiO_x$ thin film according to an embodiment, FIG. 3B is a graph showing mobility for the Li-doped $NiO_x$ thin film according to an embodiment, and FIG. 3C is a graph showing resistivity of the Li-doped $NiO_x$ thin film according to an embodiment.

Referring to FIG. 3A, as oxygen was increased, the carrier concentration of the Li doped $NiO_x$ thin film increased but was controlled within a range of $1\times10^{18}$ $cm^{-3}$ to $1\times10^{22}$ $cm^{-3}$. Referring to FIG. 3B, the mobility of the Li-doped $NiO_x$ thin film tended to decrease, while the oxygen content was increased. Referring to FIG. 3C, the resistivity of the Li-doped $NiO_x$ thin film was reduced to less than 1 Ωcm during the oxygen injection.

Evaluation 2: Optical Properties of Nickel Oxide Thin Films (1) In order to evaluate optical characteristics of the undoped $NiO_x$ thin film for forming a p type layer in Example 1, a $NiO_x$ thin film was formed through RF sputtering and then measured with respect to transmittance of through UV-visible spectroscopy, and the results are shown in FIGS. 4A to 4E.

FIGS. 4A to 4E are graphs showing the bandgap according to oxygen partial pressure for an undoped $NiO_x$ thin film of Example 1, respectively. FIGS. 4A to 4E sequentially show bandgaps when injected under the oxygen partial pressure of 0%, 5%, 10%, 15%, and 20% during the sputtering process.

Referring to FIGS. 4A to 4E, as a result of calculating the bandgaps through the measured transmittance, the deposited $NiO_x$ thin film turned out to have a bandgap of 3.35 eV to 3.58 eV, wherein as the oxygen content was increased, the bandgap tended to decrease.

(2) In order to examine optical characteristics of the Li-doped $NiO_x$ thin film for using a p type layer in Example 2, a Li-doped $NiO_x$ thin film was formed through RF sputtering and then measured with respect to transmittance by using a UV-visible spectrometer, and the results are shown in FIGS. 5A to 5E.

FIGS. 5A to 5E are graphs showing a bandgap for the Li-doped $NiO_x$ thin film according to an embodiment. FIGS. 5A to 5E sequentially show bandgaps when injected under the oxygen partial pressure of 0%, 5%, 10%, 20%, and 30% during the sputtering process.

Referring to FIGS. 5A to 5E, as a result of calculating the bandgaps through the measured transmittance, the deposited Li-doped $NiO_x$ thin film turned out to have a bandgap of 3.37 eV to 3.54 eV, wherein as the oxygen content was increased, the bandgap tended to decrease.

Evaluation 3: Electrical Characteristics of Semiconductor Devices

Figure 6A:
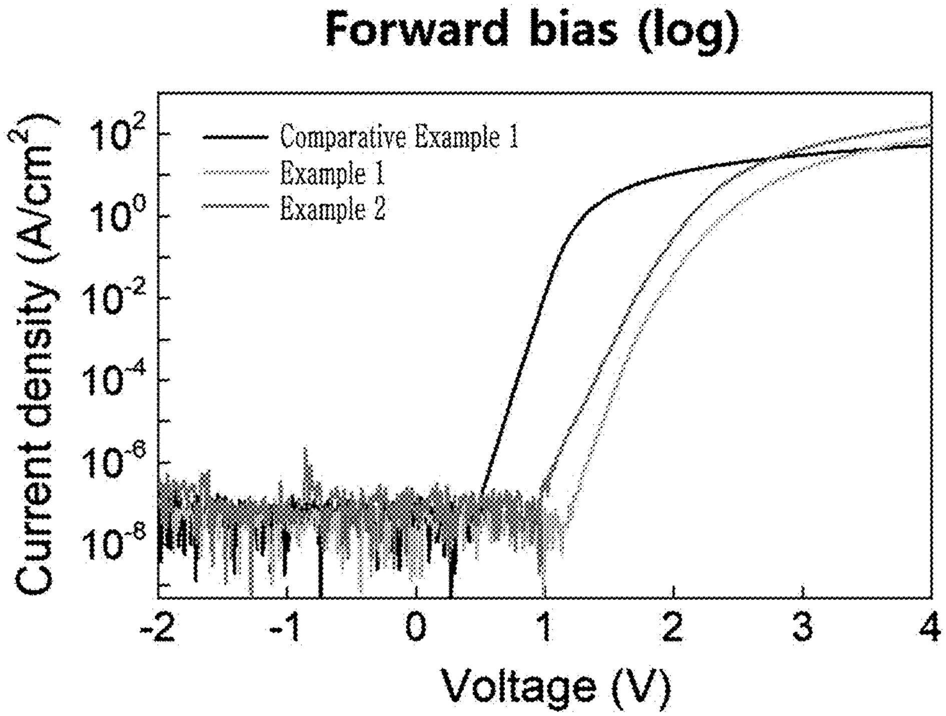
FIGS. 6A to 6C are graphs showing current characteristics of the semiconductor devices according to Examples 1 and 2 and Comparative Example 1.
Figure 6B:
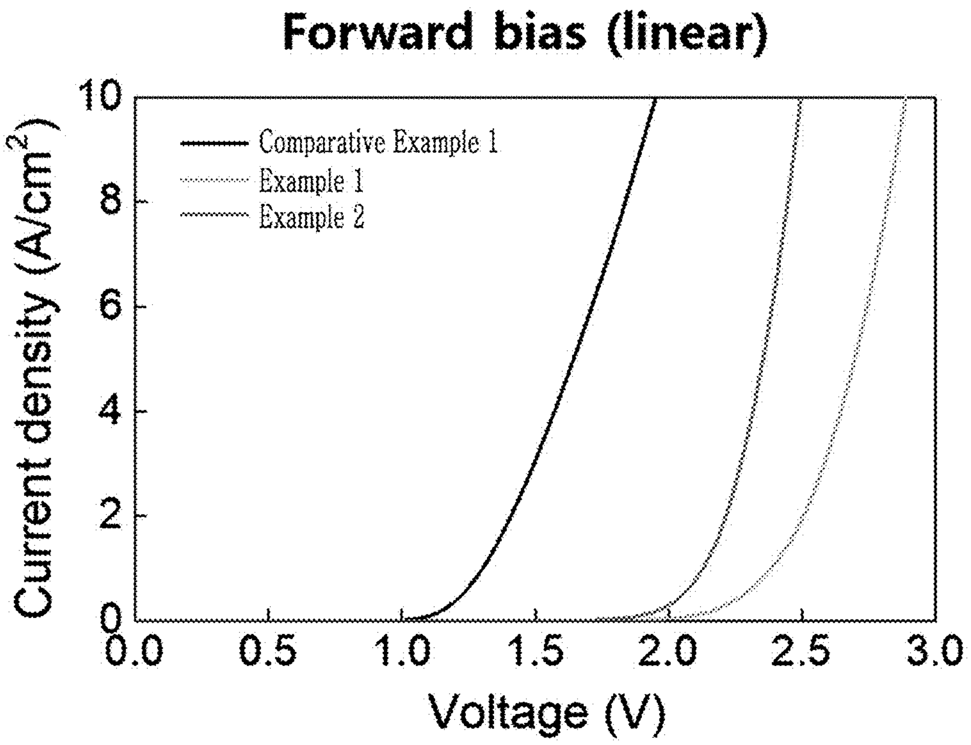
Figure 6C:
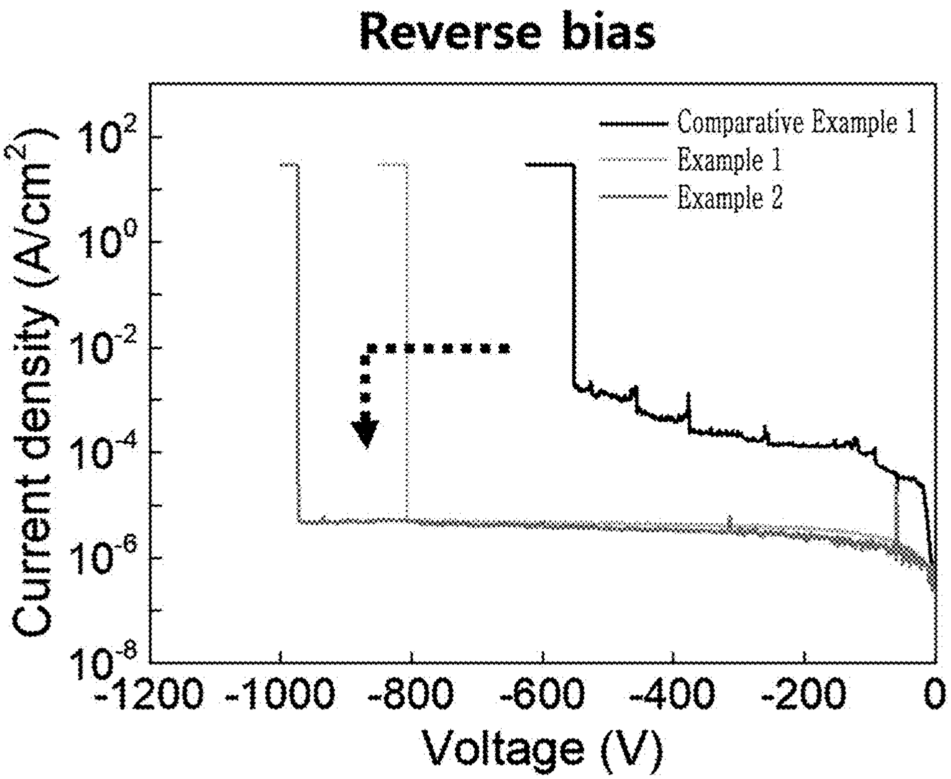

FIGS. 6A to 6C are graphs showing current characteristics of the semiconductor devices according to Examples 1 and 2 and Comparative Example 1. FIGS. 6A and 6B sequentially show a case of forward bias, and FIG. 6C shows a case of reverse bias.

Referring to FIGS. 6A and 6B, comparing current characteristics of Comparative Example 1 having no p type layer such as a SBD (Schottky barrier diode) type, Example 1 whose p type layer was formed of undoped $NiO_x$, and Example 2 whose p type layer was formed of Li-doped $NiO_x$, a current in a forward region moved to the right depending on presence or absence of the p type layer formed of $NiO_x$. In addition, referring to FIG. 6C, in the reverse region, a breakdown voltage increased in Examples 1 and 2, compared with Comparative Example 1, but a leakage current significantly decreased.

Figure 7:
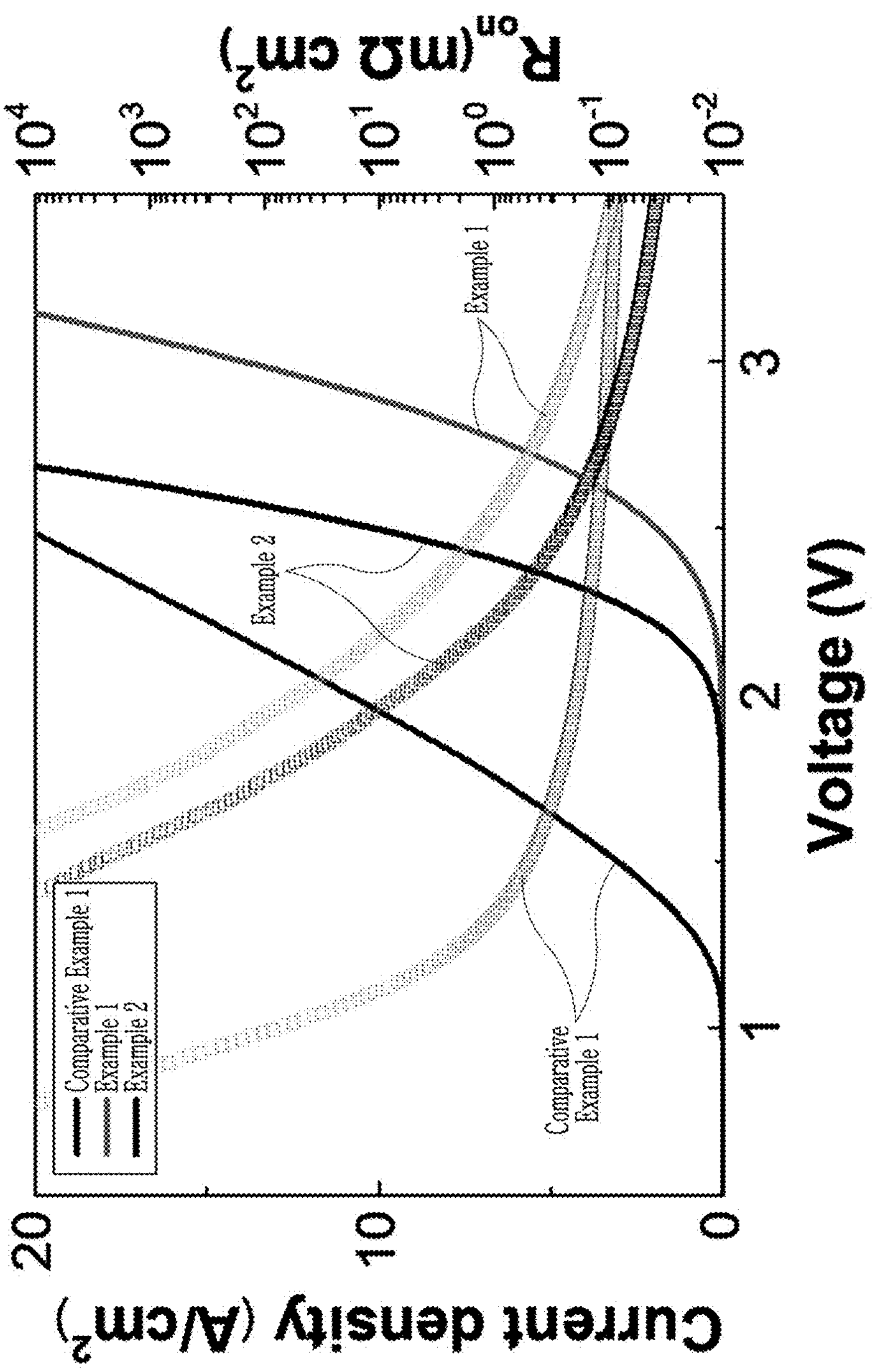
FIG. 7 is a graph showing on-resistance characteristics of the semiconductor devices according to Examples 1 and 2 and Comparative Example 1.

FIG. 7 is a graph showing on-resistance characteristics of the semiconductor devices according to Examples 1 and 2 and Comparative Example 1.

Referring to FIG. 7, Comparative Example 1 and Examples 1 and 2 exhibited on-resistance of 0.184 mΩ·cm$^2$, 52.01 mΩ·cm$^2$, and 6.71 mΩ·cm$^2$ at 2 V, and at 3 V, on-resistance of 0.097 mΩ·cm$^2$, 0.215 mΩ·cm$^2$, and 0.067 mΩ·cm$^2$. In other words, Comparative Example 1 exhibited the lowest on-resistance at 2 V, but Example 2 exhibited lower on-resistance at 3 V than Comparative Example 1. The reason is that since Examples 1 and 2, in which P-N heterojunctions were formed by inserting a p type layer, exhibited a decrease in Ni contact resistance, as a voltage was increased, the on-resistance decreased, improving a current and thereby reducing conductivity loss.

Accordingly, when a p type layer formed of $NiO_x$ was inserted on the interface between the n type layer and the electrode, a breakdown voltage was increased, improving the on-resistance characteristics. Accordingly, conductivity may be inferred to be effectively controlled by doping $NiO_x$ with Li to substitute Ni sites and thus to produce LiNi receptors or supplying reactive oxygen during deposition of the NiO thin film to induce formation of empty spaces in Ni.

Figure 8A:
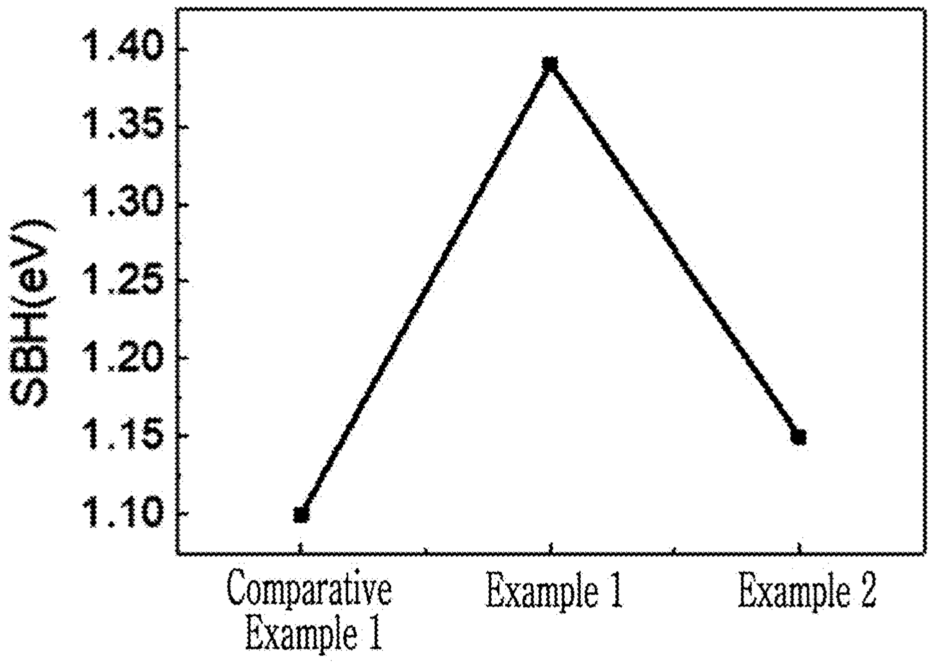
FIGS. 8A to 8C are graphs showing the electrical characteristics of the semiconductor devices according to Examples 1 and 2 and Comparative Example 1.
Figure 8B:
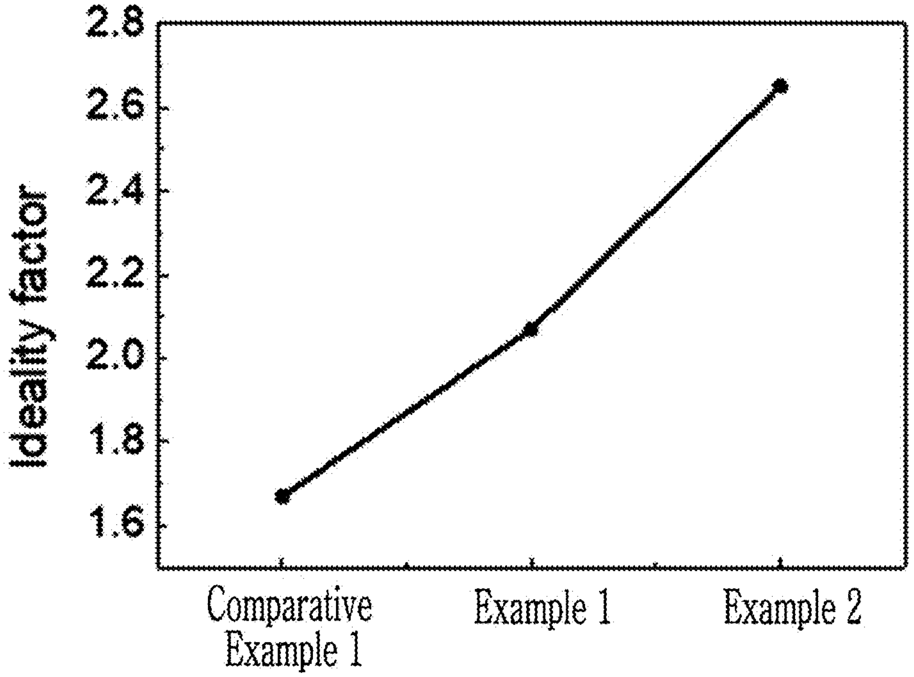
Figure 8C:
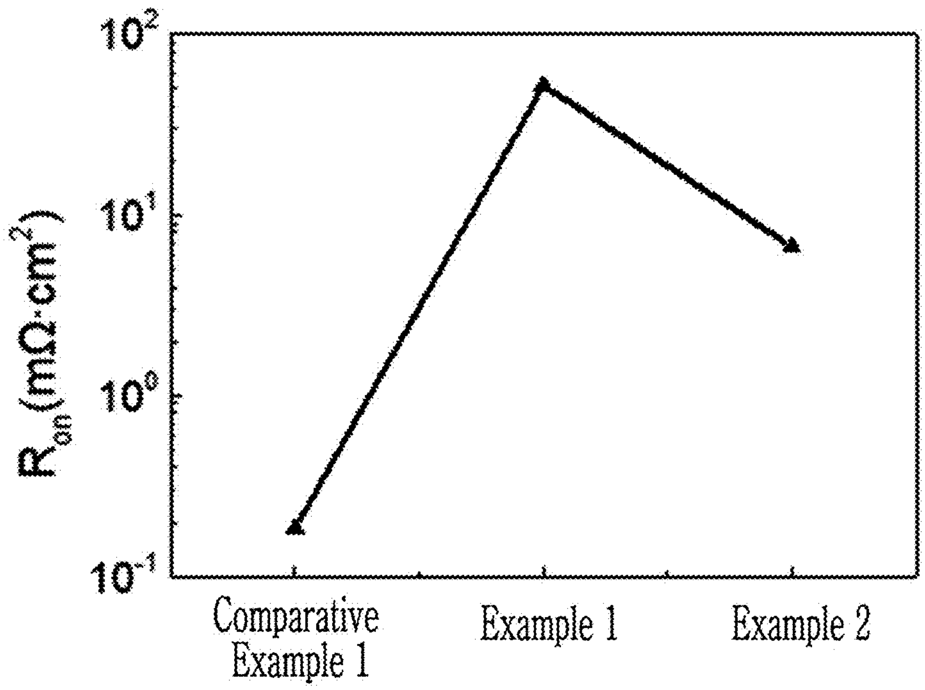

FIGS. 8A to 8C are graphs showing the electrical characteristics of the semiconductor devices according to Examples 1 and 2 and Comparative Example 1. FIG. 8A shows a Schottky barrier height (SBH), FIG. 8B shows an ideality factor, and FIG. 8C shows the on-resistance. Specifically, the electrical characteristics of the semiconductor devices according to Examples 1 and 2 and Comparative Example 1 are shown in Table 1.

TABLE 1

| | $V_{on}$ (V) | $R_{on\ @\ 2V}$ (mΩ · cm$^2$) | B.V. (V) | Ideality factor (n) | SBH (eV) |
|---|---|---|---|---|---|
| Comparative Example 1 | 1.52 | 0.184 | −552 | 1.67 | 1.10 |
| Example 1 | 2.83 | 52.01 | −807 | 2.07 | 1.39 |
| Example 2 | 2.57 | 6.71 | −974 | 2.65 | 1.15 |

Referring to FIGS. 8A to 8C and Table 1, Examples 1 and 2, where P-N heterojunctions were formed by inserting a p type layer, exhibited excellent electrical characteristics, compared with Comparative Example 1 having no p type layer.

Figure 9:
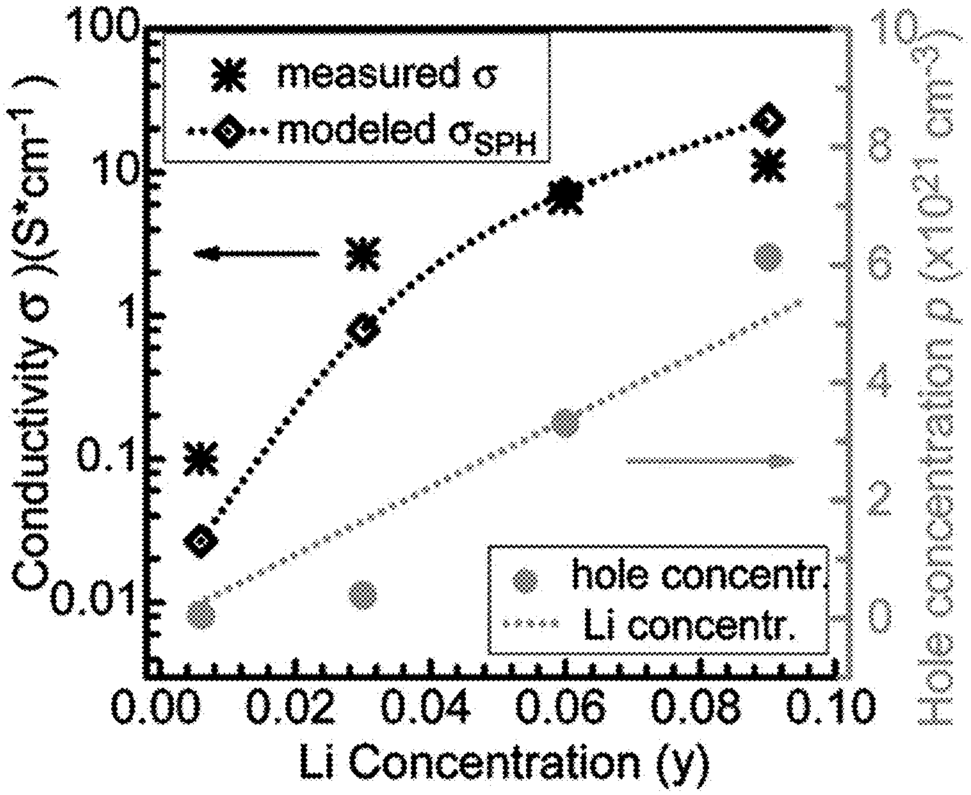
FIG. 9 is a graph showing electrical characteristics according to doping content of a Li-doped $NiO_x$ thin film according to an embodiment.

Evaluation 4: Electrical Characteristics According to Doping Content of Nickel Oxide Thin Film FIG. 9 is a graph showing electrical characteristics according to doping content of a Li-doped $NiO_x$ thin film according to an embodiment. Specifically, the electrical characteristics according to a doping content of the Li-doped $NiO_x$ thin films according to an embodiment are shown in Table 2.

Li-doped $NiO_x$ is expressed by $Li_yNi_{1-y}O_x$, wherein y indicates a Li doping content (concentration), d indicates a thickness, σ indicates conductivity, $E_a$ indicates a bandgap, S indicates conductivity, p indicates a hole carrier concentration, μ indicates hole effect mobility, and T indicates transmittance in a visible light region in Table 2.

TABLE 2

| y | d (nm) | σ (S · cm$^{-1}$) | E (eV) | S (μV · K$^{-1}$) | p (cm$^{-3}$) | μ (cm$^{-2}$ . V$^{-1}$ . s$^{-1}$) | T (%) |
|---|---|---|---|---|---|---|---|
| 0 | 31 | — | — | — | — | — | 87.3 |
| 0.006 | 32 | 0.10 | 0.224 | 649 | $5.90 \times 10^{19}$ | 0.011 | 80.9 |

TABLE 2-continued

| y | d (nm) | σ ($S \cdot cm^{-1}$) | E (eV) | S ($\mu V \cdot K^{-1}$) | p ($cm^{-3}$) | μ ($cm^{-2} . V^{-1} . s^{-1}$) | T (%) |
|---|---|---|---|---|---|---|---|
| 0.03 | 31 | 2.7 | 0.185 | 485 | $3.94 \times 10^{20}$ | 0.047 | 66.6 |
| 0.06 | 29 | 6.6 | 0.182 | 297 | $3.31 \times 10^{21}$ | 0.023 | 54.9 |
| 0.09 | 19 | 11.2 | 0.166 | 239 | $6.13 \times 10^{21}$ | 0.025 | 44 |

Referring to FIG. 9 and Table 2, as the Li doping content was increased, conductivity and a carrier concentration of a nickel oxide tended to increase, wherein its increase rate became larger from y of 0.06.

While embodiments of this invention have been described in connection with what is presently considered to be practical example embodiments, it is to be understood that the embodiments of invention are not limited to the disclosed embodiments. On the contrary, they are intended to cover various modifications and equivalent arrangements included within the spirit and scope of the appended claims.

The following reference identifiers may be used in connection with the drawings to describe various features of embodiments.

10: semiconductor device
100: substrate
200: n type layer
300: p type layer
400: first electrode
500: second electrode

What is claimed is:

1. A semiconductor device comprising:
an n type layer disposed on a first surface of a substrate, the n type layer comprising beta-gallium oxide ($\beta$-$Ga_2O_3$);
a p type layer disposed on the n type layer and comprising nickel oxide represented by a formula $M_yNi_{1-y}O_x$, wherein M is a doping element, x is $0.8 \le x \le 1.0$, and y is $0<y<1$;
a first electrode disposed on the p type layer; and
a second electrode disposed on a second surface of the substrate opposite the first surface.

2. The semiconductor device of claim 1, wherein a P-N heterojunction is present at a contact surface of the n type layer and the p type layer.

3. The semiconductor device of claim 1, wherein the substrate comprises n type gallium oxide ($Ga_2O_3$).

4. The semiconductor device of claim 3, wherein the n type gallium oxide comprises the n type gallium oxide doped with Si or Sn.

5. The semiconductor device of claim 1, wherein the substrate has a doping concentration of $1\times10^{16}$ $cm^{-3}$ to $1\times10^{20}$ $cm^{-3}$.

6. The semiconductor device of claim 1, wherein a thickness of the substrate is 100 μm to 700 μm.

7. The semiconductor device of claim 1, wherein the beta-gallium oxide comprises beta-gallium oxide doped with Si or Sn.

8. The semiconductor device of claim 7, wherein the n type layer has a doping concentration of $1\times10^{15}$ $cm^{-3}$ to $1\times10^{17}$ $cm^{-3}$.

9. The semiconductor device of claim 1, wherein a thickness of the n type layer is 1 μm to 10 μm.

10. The semiconductor device of claim 1, wherein the doping element comprises a monovalent element, a divalent element, or a combination thereof.

11. The semiconductor device of claim 10, wherein:
the monovalent element comprises Li, K, Cu, Ag, Cs, or a combination thereof; and
the divalent element comprises Mg, Ca, Sr, Ba, or a combination thereof.

12. The semiconductor device of claim 1, wherein a thickness of the p type layer is 10 nm to 300 nm.

13. The semiconductor device of claim 1, wherein the first electrode comprises an anode and the second electrode comprises a cathode.

14. A semiconductor device comprising:
an n type layer disposed on a first surface of a substrate, the n type layer comprising beta-gallium oxide ($\beta$-$Ga_2O_3$);
a p type layer disposed on the n type layer and comprising nickel oxide represented by a formula $M_yNi_{1-y}O_x$, wherein M is a doping element, x is $0.8 \le x \le 1.0$, and y is $0.06 \le y \le 0.1$;
a first electrode disposed on the p type layer; and
a second electrode disposed on a second surface of the substrate opposite the first surface.

15. The semiconductor device of claim 14, wherein a P-N heterojunction is present at a contact surface of the n type layer and the p type layer.

16. The semiconductor device of claim 14, wherein the substrate comprises n type gallium oxide ($Ga_2O_3$).

17. The semiconductor device of claim 14, wherein the substrate has a doping concentration of $1\times10^{16}$ $cm^{-3}$ to $1\times10^{20}$ $cm^{-3}$.

18. The semiconductor device of claim 14, wherein a thickness of the substrate is 100 μm to 700 μm.

19. The semiconductor device of claim 14, wherein the beta-gallium oxide comprises beta-gallium oxide doped with Si or Sn.

20. A semiconductor device comprising:
a substrate comprising n type gallium oxide doped with Si or Sn;
an n type layer disposed on a first surface of the substrate, the n type layer comprising beta-gallium oxide ($\beta$-$Ga_2O_3$) doped with Si or Sn;
a p type layer disposed on the n type layer and comprising nickel oxide represented by a formula $M_yNi_{1-y}O_x$, wherein M is a doping element, x is $0.8 \le x \le 1.0$, and y is $0.06 \le y \le 0.1$;
a P-N heterojunction disposed at a contact surface of the n type layer and the p type layer;
a first electrode disposed on the p type layer; and
a second electrode disposed on a second surface of the substrate opposite the first surface.

* * * * *